(12) United States Patent
Tsai et al.

(10) Patent No.: US 12,087,887 B2
(45) Date of Patent: Sep. 10, 2024

(54) WAVELENGTH CONVERSION MATERIAL, METHOD OF MANUFACTURING THEREOF AND LIGHT EMITTING DEVICE

(71) Applicant: Lextar Electronics Corporation, Hsinchu (TW)

(72) Inventors: Yi-Ting Tsai, Hsinchu (TW); Hung-Chia Wang, Hsinchu (TW); Chia-Chun Hsieh, Hsinchu (TW); Hung-Chun Tong, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 619 days.

(21) Appl. No.: 17/033,699

(22) Filed: Sep. 26, 2020

(65) Prior Publication Data
US 2021/0288227 A1    Sep. 16, 2021

(30) Foreign Application Priority Data
Mar. 11, 2020    (CN) .......................... 202010166214.1

(51) Int. Cl.
*H01L 33/50*    (2010.01)
*H01L 33/18*    (2010.01)

(52) U.S. Cl.
CPC ............ *H01L 33/502* (2013.01); *H01L 33/18* (2013.01); *H01L 2933/0041* (2013.01)

(58) Field of Classification Search
CPC ..................................................... H01L 33/502
USPC .......................................................... 257/79
See application file for complete search history.

(56) References Cited

U.S. PATENT DOCUMENTS

| 8,441,026 B2 | 5/2013 | Meyer et al. |
| 2010/0052513 A1 | 3/2010 | Xia et al. |
| 2018/0171222 A1* | 6/2018 | Hirosaki ............... H01L 33/502 |
| 2022/0367760 A1* | 11/2022 | Toyoshima ........ C09K 11/7734 |
| 2022/0399480 A1* | 12/2022 | Yamaura ............... H01L 33/502 |

FOREIGN PATENT DOCUMENTS

| CN | 1977030 A | 6/2007 |
| CN | 101077973 A | 11/2007 |
| CN | 101195744 A | 6/2008 |
| CN | 101696353 A | 4/2010 |
| CN | 102719246 A | 10/2012 |
| CN | 104073254 A | 10/2014 |
| CN | 105814172 A | 7/2016 |
| TW | 201221621 A | 6/2012 |

* cited by examiner

*Primary Examiner* — Hsin Yi Hsieh
(74) *Attorney, Agent, or Firm* — CKC & Partners Co., LLC

(57) ABSTRACT

The wavelength conversion material includes a general formula (I) $M_mA_aB_bC_cD_dE_e:ES_xRE_y$ and satisfies a condition (II) that a proportion of D for the wavelength conversion material greater than or equal to 50%. M is selected from a group consisting of Ca, Sr and Ba. A is selected from a group consisting of elements Mg, Mn, Zn and Cd. B is selected from a group consisting of elements B, Al, Ga and In. C is selected from a group consisting of Si, Ge, Ti and Hf. D is selected from a group consisting of elements O, S and Se. E is selected from a group consisting of elements N and P. ES is selected from a group consisting of divalent Eu, Sm and Yb. RE is selected from a group consisting of trivalent Ce, Pr, Nd, Sm, Eu, Gd, Tb, Dy, Ho, Er and Tm.

2 Claims, 4 Drawing Sheets

WAVELENGTH CONVERSION MATERIAL, METHOD OF MANUFACTURING THEREOF AND LIGHT EMITTING DEVICE

RELATED APPLICATIONS

This application claims priority to China Application Serial Number 202010166214.1, filed Mar. 11, 2020, which are herein incorporated by reference in its entirety.

BACKGROUND

Technical Field

The present disclosure relates to a wavelength conversion material, a method of manufacturing thereof and a light emitting device.

Description of Related Art

Due to the rapid development of backlit displays, the application of liquid crystal displays (LCDs) has gradually been popularized, and many products have gradually been oriented towards high technology and high specifications. The light emitting diodes (LEDs) currently used in LCDs are difficult to have both gamut coverage and lumen efficiency (lm) due to physical limitations of materials. For example, if users want to have a red fluorescent material with wavelength close to the maximum stimulus value of the human eye (555 nm), a 620 nm wavelength red fluorescent material can be used. However, the gamut coverage would be sacrificed, and the color purity would be reduced because it overlaps with the green light area.

Therefore, how to provide a red wavelength conversion material with low synthesis conditions, a narrow full width at half maximum (FWHM) of spectrum, high corresponding color purity, and no afterimage phenomenon is one of the problems that the industry wants to invest in research and development to solve.

SUMMARY

In view of this, the present disclosure provides a wavelength conversion material such that the problems mentioned above can be solved.

One aspect of the present disclosure is a wavelength conversion material. The wavelength conversion material includes a general formula (I) and satisfies a condition (II). The general formula (I) is $M_m A_a B_b C_c D_d E_e : ES_x RE_y$. M is selected from a group consisting of Ca, Sr and Ba, and $0.8 \leq m \leq 1.5$. A is selected from a group consisting of elements Mg, Mn, Zn and Cd, and $0.1 \leq a \leq 1$. B is selected from a group consisting of elements B, Al, Ga and In, and $0.5 \leq b \leq 1.5$. C is selected from a group consisting of Si, Ge, Ti and Hf, and $5 \leq c \leq 40$. D is selected from a group consisting of elements O, S and Se, and $10 \leq d \leq 80$. E is selected from a group consisting of elements N and P, and $0.01 \leq e \leq 3$. ES is selected from a group consisting of divalent Eu, Sm and Yb, and $0 \leq x \leq 1$. RE is selected from a group consisting of trivalent Ce, Pr, Nd, Sm, Eu, Gd, Tb, Dy, Ho, Er and Tm, and $0 \leq y \leq 1.0 < x+y \leq 1$. The condition (II) is that a proportion of the element D for the wavelength conversion material is greater than or equal to 50%.

In one or more embodiments, the wavelength conversion material is excited by a blue light source or an ultraviolet light source to emit a light. The light has a peak in a spectrum. The peak corresponds to a wavelength ranging from 610 nm to 655 nm.

In some embodiments, the wavelength conversion material further satisfies a condition (III). The condition (III) is that the light has a maximum intensity, a difference between maximum and minimum wavelengths corresponding to 50% of the maximum intensity is p, a difference between maximum and minimum wavelengths corresponding to 10% of the maximum intensity is q, wherein $2p \leq q \leq 5p$.

In one or more embodiments, the mentioned wavelength conversion material further includes polycrystalline phase.

In some embodiments, the mentioned wavelength conversion material further includes amorphous phase.

Another aspect of the present disclosure is a light emitting device. The light emitting device includes a light source and the wavelength conversion material mentioned above.

In one or more embodiments, the light source includes a blue light emitting diode or an ultraviolet light emitting diode.

Another aspect of the present disclosure is a method of manufacturing the wavelength conversion material mentioned above. The method includes following operations. Configure corresponding raw materials of selected elements M, A, B, C, D and E of the general formula (I) as a first mixture. Treat the first mixture under a first high-temperature process to have a first product. Configure the first product and corresponding raw materials of at least one of selected elements ES and RE of the general formula (I) as a second mixture. Treat the second mixture under a second high-temperature process in reducing atmosphere to have the wavelength conversion material.

In one or more embodiments, in the operation of configuring corresponding raw materials of selected elements M, A, B, C, D and E of the general formula (I) as the first mixture, the corresponding raw materials of selected elements M, A, B, C, D and E of the general formula (I) include oxynitride, carbonate sulfide or salts, and the corresponding raw materials of selected elements M, A, B, C, D and E of the general formula (I) are dissolved in an acidic solution to form the first mixture.

In one or more embodiments, the first high-temperature process is a sintering process between 200° C. and 600° C.

In one or more embodiments, the second high-temperature process is a calcination process between 800° C. and 1500° C.

In summary, the present disclosure provides a red wavelength conversion material with a narrow FWHM spectral characteristic, and the method of manufacturing the red wavelength conversion material is simple. The wavelength conversion material can be applied to the light emitting device.

The above description is only used to explain the problems to be solved by the present disclosure, the technical means for solving the problems and the produced effects. The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include.

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1:
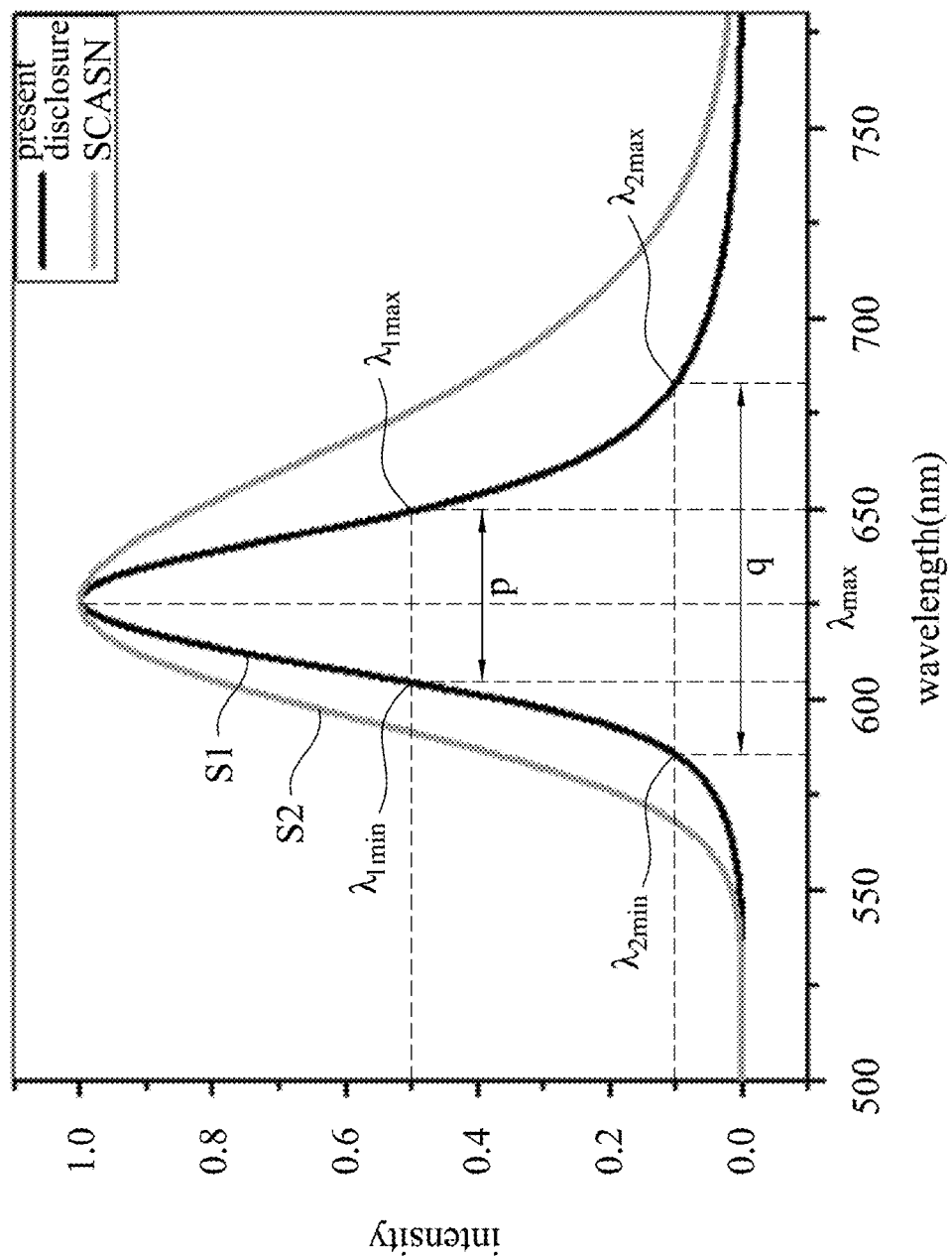
FIG. 1 illustrates an emission spectrum of a wavelength conversion material of the present disclosure and an existing fluorescent material.

One embodiment of the present disclosure provides a red wavelength conversion material having improved color purity. Reference is made by FIG. 1. FIG. 1 illustrates an emission spectrum of a wavelength conversion material of the present disclosure and an existing fluorescent material. The horizontal axis is emission wavelength. The vertical axis is the intensity of the emission, and where the maximum intensity is normalized as a standard (1.0 represents the maximum emission intensity) to show the intensity of the emission corresponding to different emission wavelengths and can be used to compare the difference between the red wavelength conversion material in the present disclosure and a conventional red fluorescent material. In various embodiments of the present disclosure, the disclosed wavelength conversion material is excited by blue light or an ultraviolet light source to emit light. The blue light source can be provided by a blue light emitting diode, and the ultraviolet light source can be provided by an ultraviolet light emitting diode, for example.

As shown in FIG. 1, the wavelength conversion material provided by an embodiment of the present disclosure has spectrum S1, and a common red fluorescent material (Sr, Ca)AlSiN$_3$:Eu (SCASN for short) has spectrum S2. In FIG. 1, the wavelength conversion material of the present disclosure has a narrower spectrum than SCASN.

In one or more embodiments of the present disclosure, a wavelength conversion material includes a general formula (I) and satisfies a condition (II). The general formula (I) is $M_m A_a B_b C_c D_d E_e:ES_x RE_y$. M is selected from a group consisting of Ca, Sr and Ba, and $0.8 \leq m \leq 1.5$. A is selected from a group consisting of elements Mg, Mn, Zn and Cd, and $0.1 \leq a \leq 1$. B is selected from a group consisting of elements B, Al, Ga and In, and $0.5 \leq b \leq 1.5$. C is selected from a group consisting of Si, Ge, Ti and Hf, and $5 \leq c \leq 40$. D is selected from a group consisting of elements O, S and Se, and $10 \leq d \leq 80$. E is selected from a group consisting of elements N and P, and $0.01 \leq e \leq 3$. ES is selected from a group consisting of divalent Eu, Sm and Yb, and $0 \leq x \leq 1$. RE is selected from a group consisting of trivalent Ce, Pr, Nd, Sm, Eu, Gd, Tb, Dy, Ho, Er and Tm, and $0 \leq y \leq 1.0 < x+y \leq 1$. The condition (II) is that a proportion of D for the wavelength conversion material is greater than or equal to 50%.

Specifically, the group consisting of divalent Eu, Sm and Yb is a group consisting of $Eu^{2+}$, $Sm^{2+}$ and $Yb^{2+}$. The group consisting of trivalent Ce, Pr, Nd, Sm, Eu, Gd, Tb, Dy, Ho, Er and Tm is a group consisting of $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$ and $Tm^{3+}$.

Users can adjust the composition and proportions of the elements in the provided wavelength conversion material with the general formula (I) $M_m A_a B_b C_c D_d E_e:ES_x RE_y$, and then can control the wavelength and color purity of the light emitted by the wavelength conversion material after being excited. The wavelength $A_{max}$ at the maximum intensity of the wavelength conversion material in the emission spectrum of the present disclosure is tunable. For details, please refer to the following discussion.

In this embodiment, it should be understood that the proportion of the element D in the general formula (I) $M_m A_a B_b C_c D_d E_e:ES_x RE_y$ of the disclosed wavelength conversion material is greater or equal to 50%. The element D of the general formula (I) can be oxygen, for example. Compared with the use of nitrogen as the main component of the fluorescent material on the market, the use of oxygen compounds as raw materials (such as nitrogen oxides) has a lower cost, so the wavelength conversion material of the present disclosure has substantially lower cost.

Back to FIG. 1. In this embodiment, the spectrum S1 of the wavelength conversion material has a maximum intensity corresponding to wavelength $A_{max}$. In some embodiments of the present disclosure, the wavelength ranges from 610 nm to 655 nm.

In one or more embodiments of the present disclosure, the wavelength conversion material with the general formula (I) $M_m A_a B_b C_c D_d E_e:ES_x RE_y$ further satisfies a condition (III), which shows that the wavelength conversion material of the present disclosure has a spectrum S1 with a narrow FWHM. The condition (III) is that the light has the maximum intensity $A_{max}$, a difference between maximum and minimum wavelengths at the intensity corresponding to 50% of the maximum intensity $A_{max}$ is p, a difference between maximum and minimum wavelengths at the intensity corresponding to 10% of the maximum intensity λmax is q, and 2p≤q≤5p. As shown in FIG. 1 in this embodiment, the difference q is greater than two times of the difference p. In other words, according to an embodiment of the present disclosure, the wavelength conversion material exhibits a narrower half-height spectrum S1 than the existing red fluorescent material SCASN. Therefore, the red wavelength conversion material of the present disclosure has higher color purity than the existing red fluorescent material SCASN.

Figure 2:
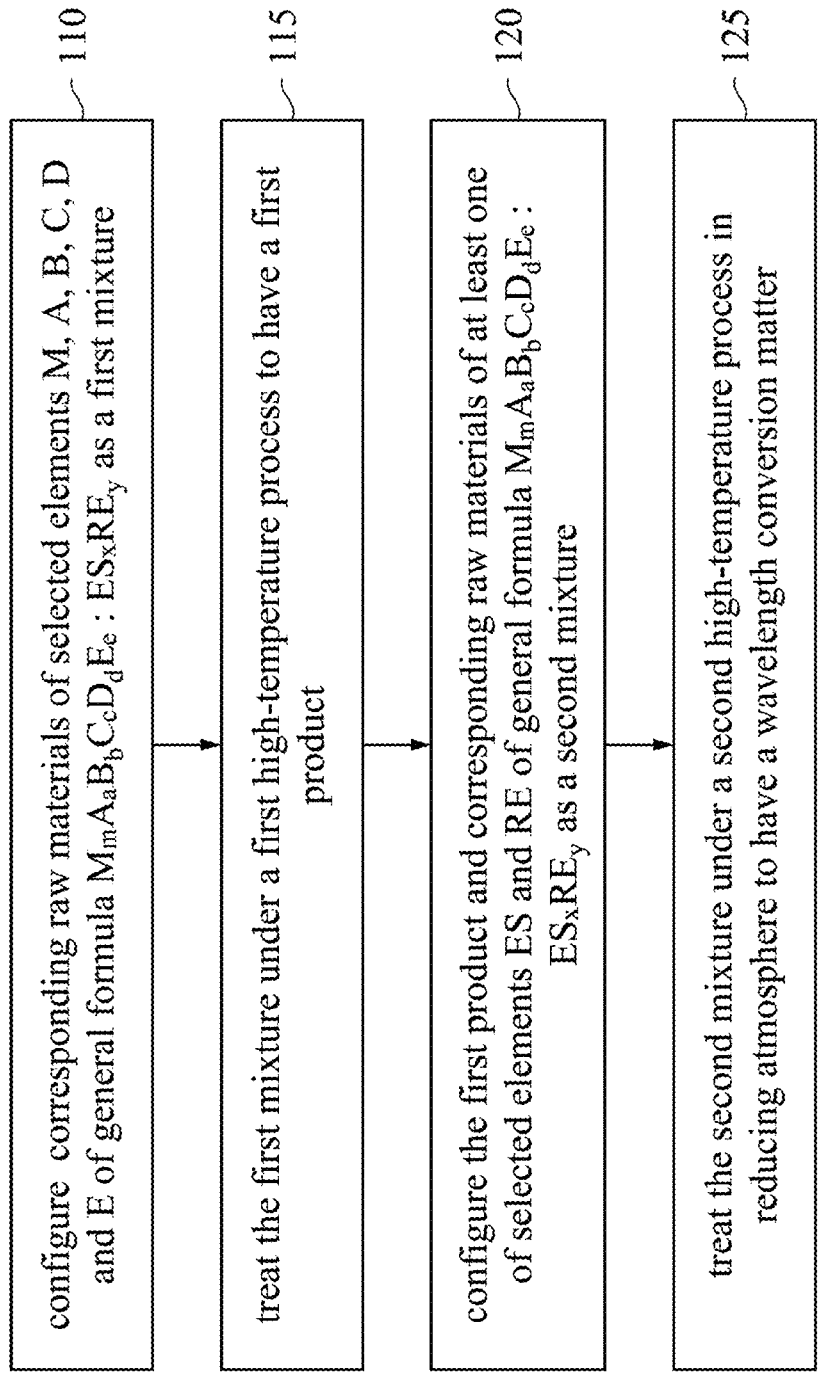
FIG. 2 is a flowchart illustrating a method of manufacturing a wavelength conversion material according to one embodiment of the present disclosure.

Reference is made by FIG. 2. FIG. 2 is a flowchart illustrating a method 100 of manufacturing a wavelength conversion material according to one embodiment of the present disclosure.

In FIG. 2, it needs to remix the elements in the general formula (I) $M_m A_a B_b C_c D_d E_e:ES_x RE_y$ to have the wavelength conversion material. In operation 110, remix the elements M, A, B, C, D and E of the general formula (I) $M_m A_a B_b C_c D_d E_e \ ES_x RE_y$.

Specifically, in operation 110, users can configure corresponding raw materials of selected elements M, A, B, C, D and E of the general formula (I) as a first mixture. In other words, the corresponding raw materials of selected elements M, A, B, C, D and E of the general formula (I) include oxynitride, carbonate sulfide or salts, and the raw materials respectively have elements M, A, B, C, D and E. For example, in some embodiments, mix nitride, oxide, sulfide, carbonate or salt materials such as Group 1A (such as NaF, $Na_2CO_3$) about 4.2 grams, Group 2A (such as $Ca_3N_2$, $CaCO_3$, $SrCO_3$) about 14.8 grams, Group 4A (such as $SiO_2$, $Si_3N_4$) About 20.5 grams, Group IIB (such as ZnO, ZnS) is about 16.45 grams, and Group IIIB (such as AlN) is about 12.3 grams. In some embodiments, in operation 110, the corresponding raw materials including the elements M, A, B, C, D and E are dissolved in an acidic solution to form the first mixture, wherein the corresponding raw materials can be nitride, oxide, sulfide, carbonate or salts. In some embodiments, the acidic solution is, for example, dilute nitric acid. In some embodiments, the acidic solution can also be other acidic solutions with greater pH and less acidity, such as dilute hydrochloric acid or dilute sulfuric acid.

After the first mixture is formed in operation 110, proceed to operation 115. In operation 115, treat the first mixture under a first high-temperature process to obtain a first product. In some embodiments, the first high-temperature process is a sintering process between 200° C. and 600° C. to sinter the first mixture including elements M, A, B, C, D and E together. In some embodiments in which the first mixture is configured with an acidic solution, the first high-temperature process can remove moisture from the acidic solution. In some embodiments, the first mixture can be placed in a high-temperature-resistant ceramic container and sintered at 200-600° C. from high to low for about 168 hours to obtain the first product.

In operation 120, configure the first product and corresponding raw materials of at least one of selected elements ES and RE of the general formula (I) $M_m A_a B_b C_c D_d E_e$: $ES_x RE_y$ as a second mixture. In some embodiments, after the first product is cooled to room temperature, the first product be taken out and ground. At the same time, mix in an appropriate amount of $SiO_2$ and a trace of EuN to mix into the first product to obtain the second mixture.

Continued with operation 120, in operation 125, treat the second mixture under a second high-temperature process in reducing atmosphere to obtain the wavelength conversion material. In some embodiments, the second high-temperature process is a calcination process between 800° C. and 1500° C. For example, the second product mixed with an appropriate amount of $SiO_2$ and a trace amount of EuN can be calcined in a reducing atmosphere at 800 to 1500° C. for at least 144 hours, and then cooled to room temperature to obtain the wavelength conversion material.

Therefore, in comparison with the existing fluorescent material, composition of an oxygen element for the wavelength conversion material of the present disclosure exceeds 50%, and the manufacturing cost is reduced and the color purity is improved.

In some embodiments, the chemical formula of the wavelength conversion material of the present disclosure may be expressed as $65SiO_2$-17(Ca,Sr)$CO_3$-23AlN-5ZnS-0.125EuN. In another embodiment of the present disclosure, the chemical formula of another wavelength conversion material can be expressed as $65SiO_2$-17(Ca,Sr)$CO_3$-23AlN-5ZnS-0.25EuN. The difference between the two wavelength conversion material is the proportion of EuN, which corresponds to the amount of EuN added in the process 125. In some embodiments, the greater ratio of EuN in the wavelength conversion material, the longer the emission wavelength corresponding to the maximum intensity (peak) in the emission spectrum. For example, the wavelength conversion material with the chemical formula $65SiO_2$-17(Ca, Sr)$CO_3$-23AlN-5ZnS-0.125EuN has a spectrum with a first wavelength corresponding to a peak (maximum intensity), the wavelength conversion material with the chemical formula $65SiO_2$-17(Ca, Sr)$CO_3$-23AlN-5ZnS-0.25EuN has a spectrum with a second wavelength corresponding to another peak (maximum intensity), and the first wavelength is less than the second wavelength.

Figure 3:
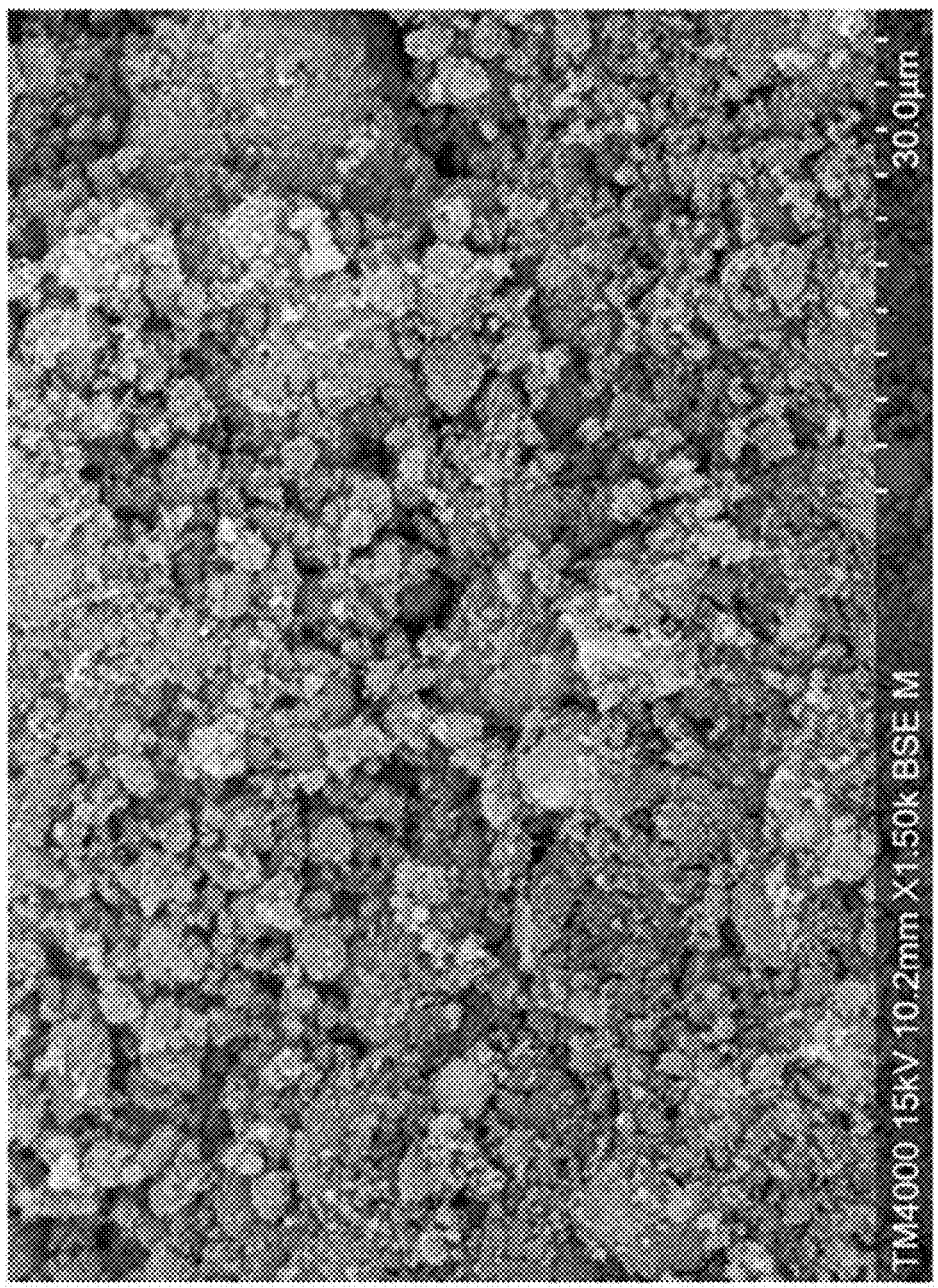
FIG. 3 is an enlarged view of a wavelength conversion substance under a scanning electron microscope according to one embodiment of the present disclosure.

FIG. 3 is an enlarged view of a wavelength conversion material under a scanning electron microscope (SEM for short) according to one embodiment of the present disclosure. As shown in FIG. 3, in this embodiment, the disclosed wavelength conversion material includes polycrystalline phase. In this embodiment, the disclosed wavelength conversion material further includes amorphous phase. In other words, in this embodiment, the wavelength conversion material includes polycrystalline phase and amorphous phase at the same time.

Therefore, a red wavelength conversion material suitable for backlight modules for display can be manufactured. The wavelength conversion material having a spectrum with a FWHM of about 30 nm to 60 nm at a wavelength corresponding to the emission intensity is synthesized by using general nitride and oxide. This solves the problem of low color purity of existing red fluorescent materials, and has the characteristics of spectral tunability and no afterimage. In addition, the wider spectrum can be applied to high CRI lighting.

According to one embodiment of the present disclosure, a light emitting device includes the mentioned wavelength conversion material, which includes the general formula (I) and satisfies the conditions (II) and (III). The wavelength conversion material can be excited by blue light or ultraviolet light to emit red light, and the wavelength range of the red light is approximately between 610 nm and 655 nm.

In some embodiment, the light emitting device further has a green wavelength conversion material mixed with the mentioned red wavelength conversion material of the present disclosure, so that the light emitting device emits white light. The green wavelength conversion substance can be green phosphor or green quantum dots, among which the green phosphor can be β-SiAlON green phosphor, silicate green phosphor, nitride series green phosphor, etc. The green quantum dot can be CdSe, CdS, CdTe, SInP, InN, AlInN, InGaN, AlGaInN, CuInGaSe, and all-inorganic perovskite quantum dots whose chemical formula is $CsPb(Br1-rIr)_3$, in which $0 \leq r < 0.5$.

Figure 4:
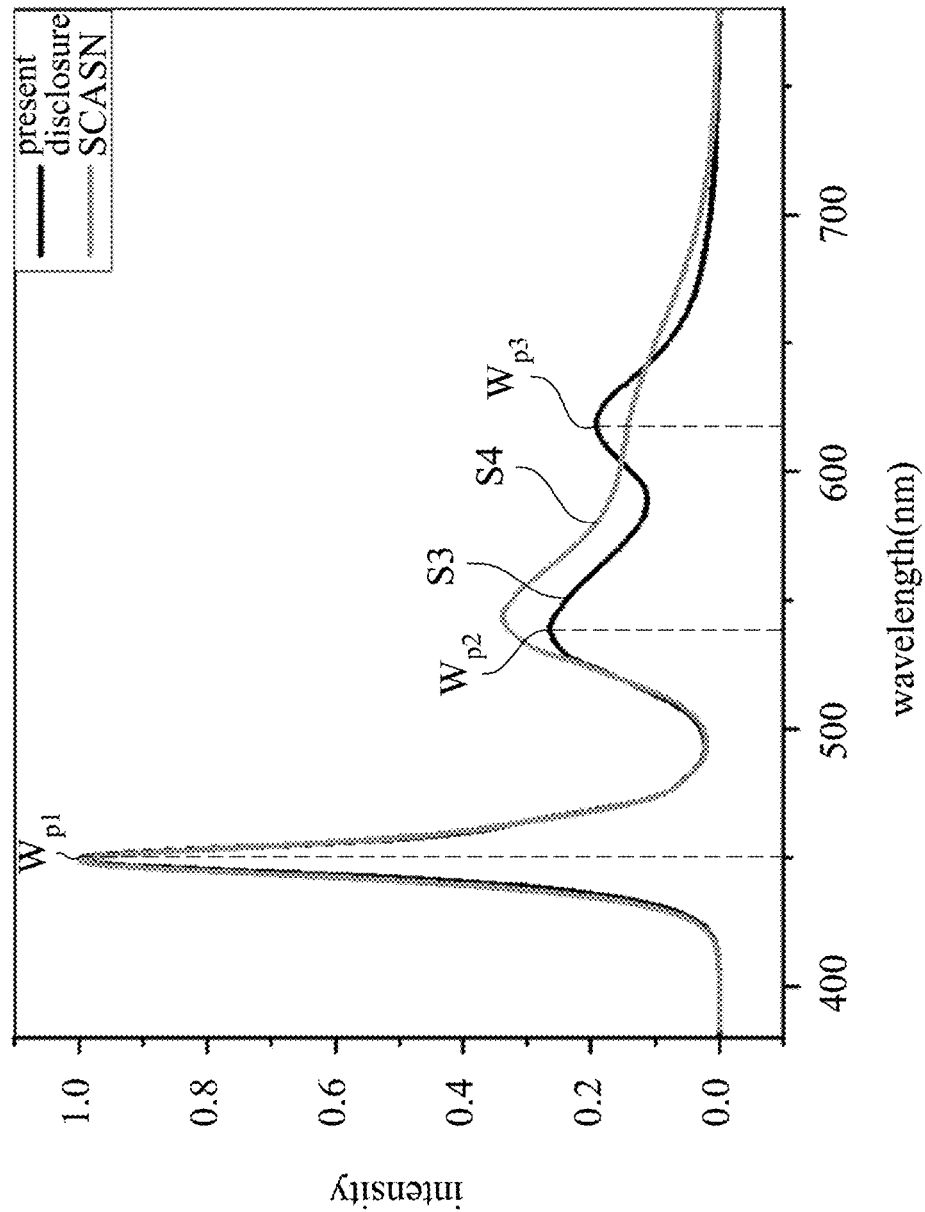
FIG. 4 is an emission spectrum showing a spectrum of a light emitting device using the wavelength conversion material mixed with green phosphors according to one embodiment of the present disclosure and a spectrum of a light emitting device using an existing fluorescent material SCASN mixed with phosphors.

FIG. 4 is an emission spectrum showing a spectrum S3 of a light emitting device using the wavelength conversion material mixed with green phosphors according to one embodiment of the present disclosure and a spectrum S4 of a light emitting device using an existing fluorescent material SCASN mixed with phosphors. The horizontal axis is emission wavelength. The vertical axis is the intensity of the emission, and where the maximum intensity is normalized as a standard (1.0 represents the maximum emission intensity) to show the intensity of the emission corresponding to different emission wavelengths. The unit of the horizontal axis is nm. Spectrum S3 corresponds to a white light emitting device, which has a blue light emitting diode with a peak wavelength of about 450 nm as the light source, a $M_m A_a B_b C_c D_d E_e : ES_x RE_y$ wavelength conversion material emitting red light and β-SiAlON green phosphor emitting green light. Spectrum S4 corresponds to another white light emitting device, which has a blue light emitting diode with a peak wavelength of about 450 nm as the light source, a red phosphor SCASN emitting red light and β-SiAlON green phosphor emitting green light.

As shown in FIG. 4, the spectrum S4 generated by the light emitting device using the red phosphor SCASN does not have a significant peak at a larger emission wavelength, indicating that red light and green light are difficult to distinguish from each other.

As shown in FIG. 4, compared with the spectrum S4 produced by the light emitting device using the red phosphor SCASN, the light emitting device using the disclosed wavelength conversion material with the general formula (1) $M_m A_a B_b C_c D_d E_e : ES_x RE_y$ of the present disclosure shows a luminous intensity curve on the spectrum S3, which can have three more obvious peaks $W_{p1}$, $W_{p2}$, $W_{p3}$, where the peak $W_{p3}$ (shown in the FIG. 4) with a luminescence wavelength exceeding 600 nm corresponds to the red light emitted by the wavelength conversion material of the present disclosure. Since the wavelength conversion material of the present disclosure has a narrow spectrum, in the white light provided by the light emitting device of the present disclosure, green light and red light can be clearly distinguished in intensity, and a better light-emitting performance can be obtained.

In summary, the present disclosure can provide a wavelength conversion material with narrow spectral characteristics. The wavelength conversion material can provide red light with greater color purity and lumen efficiency than existing fluorescent material. The present disclosure also provides a method for manufacturing the disclosed wavelength conversion material, and the manufacturing cost of this wavelength conversion material is less with respect to existing fluorescent material. The wavelength conversion material can be applied to a light emitting device, for example, as a light source of a backlight module.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:

1. A wavelength conversion material comprising a chemical formula $65SiO_2$-$17(Ca,Sr)CO_3$-$23AlN$-$5ZnS$-$0.125EuN$.

2. A wavelength conversion material comprising a chemical formula $65SiO_2$-$17(Ca,Sr)CO_3$-$23AlN$-$5ZnS$-$0.25EuN$.

* * * * *